(12) United States Patent
Jang et al.

(10) Patent No.: US 6,927,820 B2
(45) Date of Patent: Aug. 9, 2005

(54) TRANSFLECTIVE LIQUID CRYSTAL DISPLAY DEVICE AND FABRICATING METHOD THEREOF

(75) Inventors: Sang-Min Jang, Anyang-si (KR); Su-Seok Choi, Hanam-si (KR)

(73) Assignee: LG. Philips LCD Co., Ltd., Seoul (KR)

(*) Notice: Subject to any disclaimer, the term of this patent is extended or adjusted under 35 U.S.C. 154(b) by 35 days.

(21) Appl. No.: 10/602,675

(22) Filed: Jun. 25, 2003

(65) Prior Publication Data

US 2004/0124414 A1 Jul. 1, 2004

(30) Foreign Application Priority Data

Dec. 31, 2002 (KR) .................. 10-2002-0088495

(51) Int. Cl.[7] .......................... G02F 1/1335
(52) U.S. Cl. ................. 349/114; 349/113; 349/39
(58) Field of Search .................. 349/114, 113, 349/39

(56) References Cited

U.S. PATENT DOCUMENTS 5,408,345 A   4/1995  Mitsui et al.
6,195,140 B1  2/2001  Kubo et al.
6,522,377 B2 * 2/2003  Kim et al. .................. 349/114
2003/0030768 A1 * 2/2003  Sakamoto et al. .......... 349/113
2003/0058389 A1 * 3/2003  Ha et al. .................... 349/113

FOREIGN PATENT DOCUMENTS

JP  2000-111902   4/2000
JP  2000-183646   6/2000

* cited by examiner

Primary Examiner—Robert H. Kim
Assistant Examiner—Thanh-Nhan P Nguyen
(74) Attorney, Agent, or Firm—McKenna Long & Aldridge LLP

(57) ABSTRACT

An array substrate for a transflective liquid crystal display device includes: a gate line on a substrate; a data line crossing the gate line to define a pixel region having a transmissive portion and a reflective portion; a common line parallel to and spaced apart from the gate line; a thin film transistor connected to the gate and data lines, the thin film transistor including a gate electrode, an active layer, and source and drain electrodes; a capacitor electrode extending from the drain electrode and overlapping the common line; a reflective layer covering the common line and the thin film transistor and corresponding to the reflective portion; and a transparent electrode connected to the drain electrode and disposed in the pixel region.

28 Claims, 16 Drawing Sheets

TRANSFLECTIVE LIQUID CRYSTAL DISPLAY DEVICE AND FABRICATING METHOD THEREOF

This application claims the benefit of Korean Patent Application No. 2002-88495, filed on Dec. 31, 2002, which is hereby incorporated by reference for all purposes as if fully set forth herein.

BACKGROUND OF THE INVENTION

1. Field of the Invention

The present invention relates to a liquid crystal display device, and more particularly to a transflective liquid crystal display device selectively using reflective and transmissive modes, and a fabricating method thereof.

2. Discussion of the Related Art

Generally, transflective liquid crystal display (LCD) devices function as both transmissive and reflective LCD devices at the same time. Because the transflective LCD devices can use both the light from a backlight, and exterior natural or artificial light, transflective LCD devices may be used in more circumstances and the power consumption of the transflective LCD devices may be reduced.

FIG. 1 is a schematic cross-sectional view of an array substrate for a transflective liquid crystal display device according to the related art. A gate line 52 and a data line 62 are formed on a substrate 50. The gate line 52 and the data line 62 cross each other to define a pixel region "P." A thin film transistor (TFT) "T" including a gate electrode 54, an active layer 56, and source and drain electrodes 58 and 60 are disposed the intersection of the gate line 52 and the data line 62. The pixel region "P" includes a reflective portion "C" and a transmissive portion "D." A reflective electrode 64 and a transparent electrode 66 correspond to the reflective portion "C" and the transmissive portion "D," respectively. An island shaped metal pattern 63 overlaps a portion of the gate line 52 and contacts the reflective electrode 64 or the transparent electrode 66. The metal pattern 63 and the overlapped portion of the gate line 52 constitute a storage capacitor "$C_{ST}$."

FIGS. 2 and 3 are schematic cross-sectional views of a transflective liquid crystal display device according to first and second embodiments of the related art. FIGS. 2 and 3 are taken along a line "II—II" of FIG. 1. First and second substrates 50 and 80 face each other and are spaced apart from each other. The first and second substrates 50 and 80 include a plurality of pixel regions "P." A gate line (not shown) and a data 62 line crossing each other are formed on an inner surface of the first substrate 50. Red, green and blue (not shown) sub-color filters 84a and 84b are formed on an inner surface of the second substrate 80, and a black matrix 82 is disposed between the sub-color filters 84a and 84b. A transparent common electrode 86 is formed on the sub-color filters 84a and 84b, and the black matrix 82. The pixel region "P" includes a reflective portion "C" and a transmissive portion "D." Generally, a reflective electrode 64 corresponding to the reflective portion "C" and a transparent electrode 66 corresponding to the transmissive portion "D" are formed over an inner surface of the first substrate 50. The reflective electrode 64 having a transmissive hole "H" can be formed over or under the transparent electrode 66.

Reducing the color difference between the reflective and transmissive portions "C" and "D" is very important in the transflective LCD device. In FIG. 2, because the light path (the distance that the light travels when light passes through the liquid crystal layer) in the reflective portion "C" is different from that in the transmissive portion "D," the polarization properties in the reflective and transmissive portions "C" and "D" are also different from each other. In the transmissive portion "D", the light passes through a liquid crystal layer 90 having a thickness "d." In the reflective portion "C," light passes through the liquid crystal layer 90, is reflected at the reflective electrode 64, and then passes through the liquid crystal layer 90 again. Accordingly, the light path in the reflective portion "C" is twice the length of that in the transmissive portion "D." Thus, the light has different polarization properties in the reflective and transmissive portions "C" and "D," thereby a difference in color purity may occur.

To solve this problem, as shown in FIG. 3, an insulating layer 63 in the transmissive portion "D" has an open portion 61 so that the light path in the reflective portion "C" can be the same as that in the transmissive portion "D." When the liquid crystal layer 90 in the reflective portion "C" has a thickness of "d," the liquid crystal layer 90 in the transmissive portion "D" has a thickness of "2d," i.e., the liquid crystal layer 90 has a dual cell gap.

However, even though light efficiency of the reflective portion "C" is the same as that of the transmissive portion "D" due to the dual cell gap, uniform color purity cannot be obtained. The sub-color filter "R" in the reflective portion "C" has the same thickness as that in the transmissive portion "D." Light passes through the sub-color filter "R" twice in the reflective portion "C," while light passes through the sub-color filter "R" just once in the transmissive portion "D." Accordingly, even though a light source for the transmissive mode is brighter than that for a reflective mode, light emitted from the reflective portion "C" has higher color purity than that emitted from the transmissive portion "D." To solve this problem, a method is suggested wherein the sub-color filter corresponding to the reflective portion has a hole.

FIG. 4 is a schematic plane view showing a sub-color filter for a transflective liquid crystal display device according to a third embodiment of the related art. A sub-color filter 84 corresponds to reflective and transmissive portions "C" and "D." The sub-color filter 84 corresponding to the reflective portion "C" has a hole 88 filled with organic material (not shown). Because the hole 88 transmits light in the reflective portion "C," the hole 88 reduces absorption of light in the whole sub-color filter 84.

FIGS. 5A to 5C are schematic cross-sectional views showing a fabricating method of a sub-color filter for a transflective liquid crystal display device according to the third embodiment of the related art. FIGS. 5A to 5C are taken along a line "V—V" of FIG. 4.

In FIG. 5A, a sub-color filter 84 is formed on a substrate 80 by coating a color resin. In FIG. 5B, a hole 88 is formed in the sub-color filter 84 corresponding to a reflective portion "C" by patterning. In FIG. 5C, an overcoat layer 90 is formed on the sub-color filter 84 by depositing a transparent organic material. A transparent common electrode 92 is formed on the overcoat layer 90.

In the above structure, however, light passing through the hole 88 has a poor wavelength filtering effect so that color purity of the whole sub-color filter 84 is reduced. Moreover, because the hole 88 has a diameter over about 10 μm due to the color resin property, the average effect between the light passing the hole 88 and the sub-color filter 84 is reduced.

To solve this problem, a method decreasing the color difference between the reflective and transmissive portions by forming a transparent buffer layer under the sub-color filter in the reflective portion is suggested. In this method, because the thickness of the sub-color filter in the transmissive portion is twice of that in the reflective portion, the color difference between the reflective and transmissive portions is reduced.

FIG. 6 is a schematic cross-sectional view of a transflective liquid crystal display device according to a fourth embodiment of the related art. FIG. 6 is taken along a line "II—II" of FIG. 1. The first and second substrates 50 and 80 having a pixel region "P" face each other and are spaced apart from each other, and a liquid crystal layer 90 is interposed therebetween. A black matrix 82 and red and green sub-color filters 84a and 84b are formed on an inner surface of the second substrate 80. A common electrode 86 is formed on the red and green sub-color filters 84a and 84b. Even though not shown in FIG. 6, a planarization layer can be formed between the common electrode 86 and the sub-color filters 84a and 84b.

The pixel region "P" includes a reflective portion "C" and a transmissive portion "D." A reflective electrode 64 and a transparent electrode 66 correspond to the reflective and transmissive portions "C" and "D," respectively. Generally, the reflective electrode 64 having a hole "H" is formed under the transparent electrode 66. Because an insulating layer 63 under the reflective electrode 64 has an open portion corresponding to the hole "H," the liquid crystal layer 90 in the transmissive portion "D" has a thickness of "2d" when the liquid crystal layer 90 in the reflective portion "C has a thickness of "d," i.e., the thickness of the liquid crystal layer 90 in the transmissive portion "D" is substantially twice of that in the reflective portion "C."

A buffer layer 83 corresponding to the reflective portion "C" is formed between the second substrate 80 and the sub-color filters 84a and 84b. The color resin flows to form the sub-color filters 84a and 84b. Accordingly, the sub-color filters 84a and 84b in the transmissive portion "D" has a thickness of "2t," while the sub-color filters 84a and 84b in the reflective portion "C" has a thickness of "t."

However, because the buffer layer is formed in the reflective portion, the fabricating process of the buffer layer is not simple and a production yield is reduced. Especially, when the reflective and transmissive portions are disposed as in FIG. 1, the reflective electrode is elongated along a direction parallel to the data line. Accordingly, the reflection efficiency is reduced in the right and left views.

SUMMARY OF THE INVENTION

Accordingly, the present invention is directed to a liquid crystal display device that substantially obviates one or more of the problems due to limitations and disadvantages of the related art.

An advantage of the present invention is to provide a transflective liquid crystal display device having a reflective portion disposed at one side of a pixel region.

An advantage of the present invention is to provide a transflective liquid crystal display device having a buffer layer with a simple structure corresponding to a reflective portion.

Another advantage of the present invention is to provide a transflective liquid crystal display device having an improved light efficiency, a uniform color difference and an improved production yield.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an array substrate for a transflective liquid crystal display device includes: a gate line on a substrate; a data line crossing the gate line to define a pixel region having a transmissive portion and a reflective portion; a common line parallel to and spaced apart from the gate line; a thin film transistor connected to the gate and data lines, the thin film transistor including a gate electrode, an active layer, and source and drain electrodes; a capacitor electrode extending from the drain electrode and overlapping the common line; a reflective layer covering the common line and the thin film transistor and corresponding to the reflective portion; and a transparent electrode connected to the drain electrode and disposed in the pixel region.

In another aspect of the present invention, a fabricating method of an array substrate for a transflective liquid crystal display device includes: forming a gate line, a gate electrode and a common line on a substrate having a pixel region including a transmissive portion and a reflective portion, the gate electrode being connected to the gate line, the common line being parallel to the gate line; forming a first insulating layer on the gate line, the gate electrode and the common line; forming an active layer on the first insulating layer over the gate electrode; forming source and drain electrodes on the semiconductor layer, a data line and a capacitor electrode on the first insulating layer, the source and drain electrodes being spaced apart from each other, the capacitor electrode extending from the drain electrode and overlapping the common line, the data line crossing the gate line and being connected to the source electrode, the gate electrode, the active layer and source and drain electrodes constituting a thin film transistor; forming a second insulating layer on the source and drain electrodes, the data line and the capacitor electrode; forming a reflective layer on the second insulating layer, the reflecting layer covering the common line and the thin film transistor; forming a third insulating layer on the reflective layer; and forming a transparent electrode on the third insulating layer in the pixel region, the transparent electrode being connected to the drain electrode.

In another aspect of the present invention, a transflective liquid crystal display device includes: first and second substrates facing each other and being spaced apart from each other; a gate line on an inner surface of the first substrate; a data line crossing the gate line to define a pixel region having a transmissive portion and a reflective portion; a common line parallel to and spaced apart from the gate line; a thin film transistor connected to the gate and data lines, the thin film transistor including a gate electrode, an active layer, and source and drain electrodes; a capacitor electrode extending from the drain electrode and overlapping the common line; a reflective layer covering the common line and the thin film transistor and corresponding to the reflective portion; a transparent electrode connected to the drain electrode and disposed in the pixel region; a black matrix on an inner surface of the second substrate; a buffer layer on the black matrix, the buffer layer being transparent and corresponding to the reflective portion; a color filter layer on the buffer layer in the pixel region, the color filter layer having a first thickness in the transmissive portion and a second thickness in the reflective portion, the first thickness being substantially twice of the second thickness; a common electrode on the color filter layer; and a liquid crystal layer between the transparent electrode and the common electrode.

In an other aspect of the present invention, a fabricating method of a transflective liquid crystal display device includes: forming a gate line, a gate electrode and a common line on a first substrate having a pixel region including a transmissive portion and a reflective portion, the gate electrode being connected to the gate line, the common line being parallel to the gate line; forming a first insulating layer on the gate line, the gate electrode and the common line; forming an active layer on the first insulating layer over the gate electrode; forming source and drain electrodes on the semiconductor layer, a data line and a capacitor electrode on the first insulating layer, the source and drain electrodes being spaced apart from each other, the capacitor electrode extending from the drain electrode and overlapping the common line, the data line crossing the gate line and being connected to the source electrode, the gate electrode, the active layer and source and drain electrodes constituting a thin film transistor; forming a second insulating layer on the source and drain electrodes, the data line and the capacitor electrode; forming a reflective layer on the second insulating layer, the reflective layer covering the common line and the thin film transistor; forming a third insulating layer on the reflective layer; forming a transparent electrode on the third insulating layer in the pixel region, the transparent electrode being connected to the drain electrode; forming a black matrix on a second substrate having the pixel region including the transmissive portion and the reflective portion; forming a buffer layer on the black matrix, the buffer layer being transparent and corresponding to the reflective portion; forming a color filter layer on the buffer layer in the pixel region, the color filter layer having a first thickness in the transmissive portion and a second thickness in the reflective portion, the first thickness being substantially twice of the second thickness; forming a common electrode on the color filter layer; attaching the first and second substrates such that the transparent electrode faces into the common electrode; and forming a liquid crystal layer between the transparent electrode and the common electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to embodiments of the present invention, examples of which are illustrated in the accompanying drawings. Wherever possible, similar reference numbers will be used throughout the drawings to refer to the same or like parts.

Figure 1:
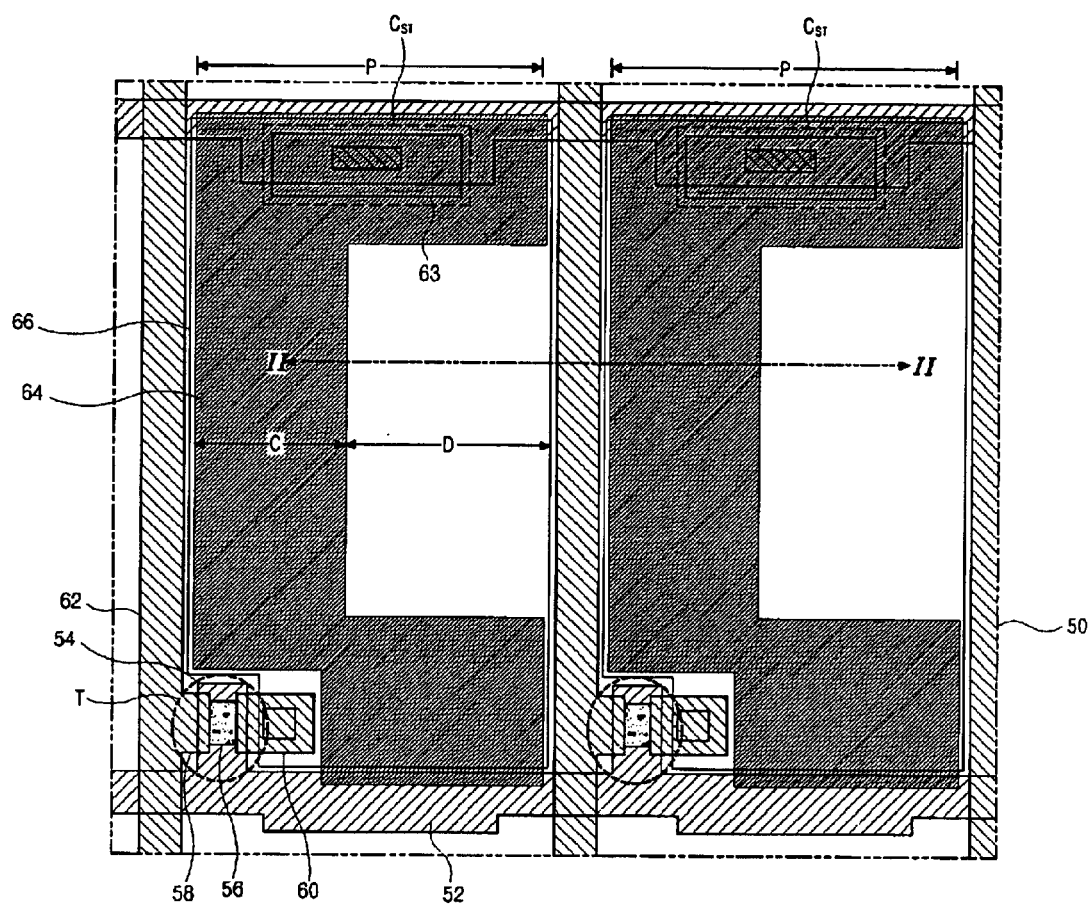
FIG. 1 is a schematic cross-sectional view of an array substrate for a transflective liquid crystal display device according to the related art.
Figure 2:
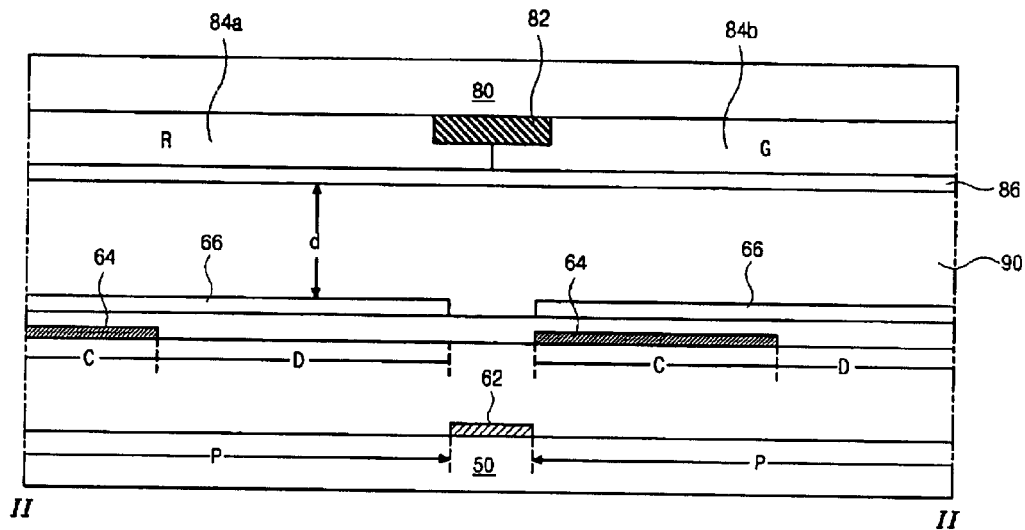
FIG. 2 is a schematic cross-sectional view of a transflective liquid crystal display device according to a first embodiment of the related art.
Figure 3:
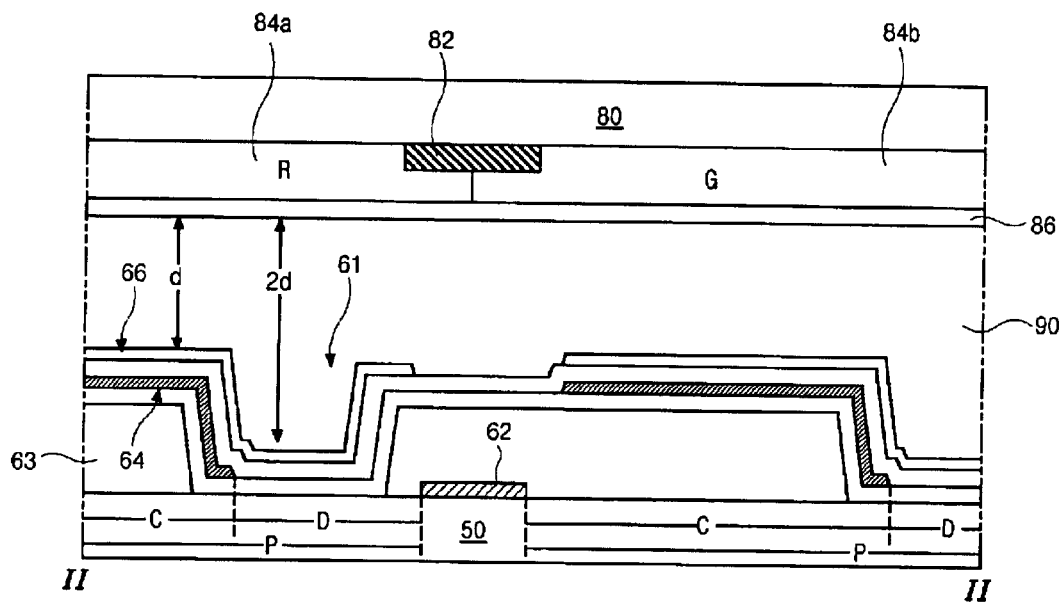
FIG. 3 is a schematic cross-sectional view of a transflective liquid crystal display device according to a second embodiment of the related art.
Figure 4:
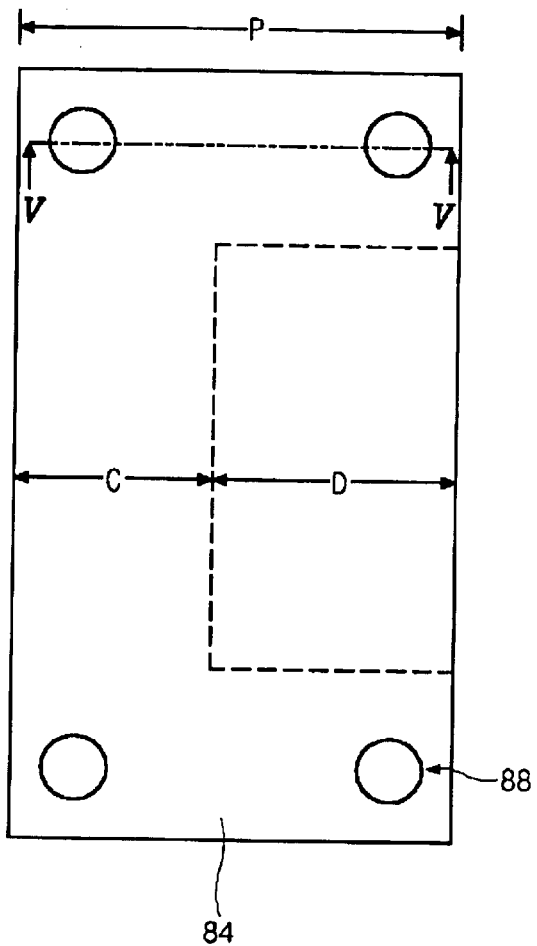
FIG. 4 is a schematic plane view showing a sub-color filter for a transflective liquid crystal display device according to a third embodiment of the related art.
Figure 5A:
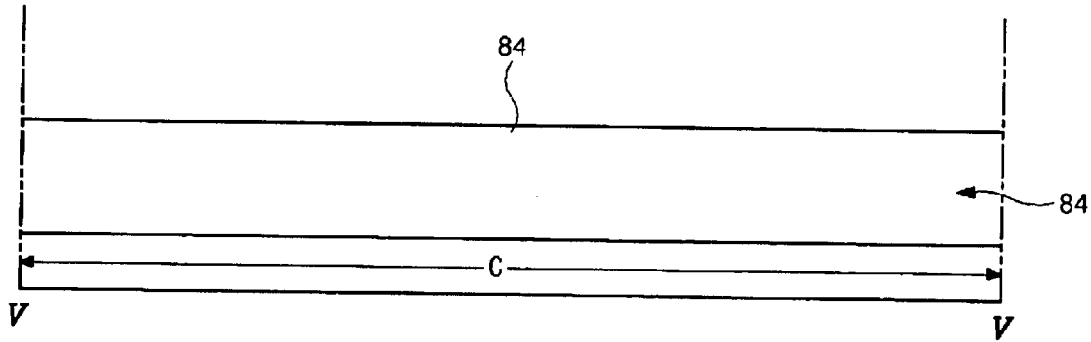
FIGS. 5A to 5C are schematic cross-sectional views showing a fabrication method of a sub-color filter for a transflective liquid crystal display device according to a third embodiment of the related art.
Figure 5B:
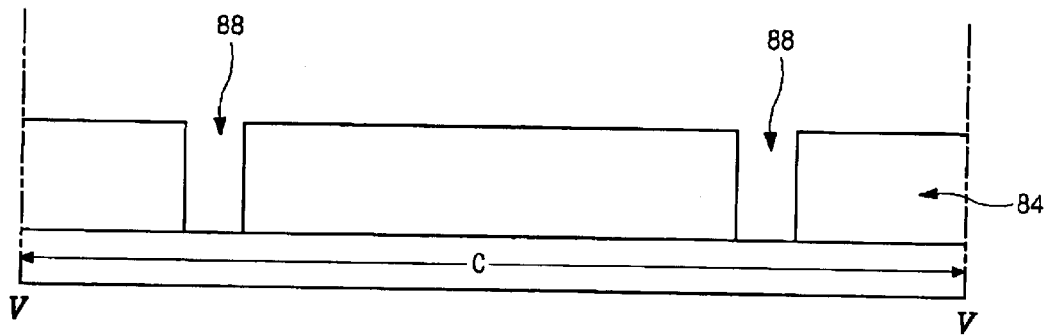
Figure 5C:
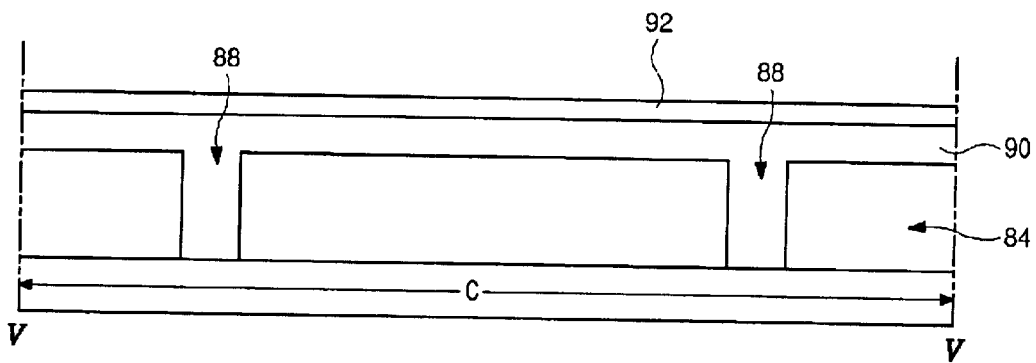
Figure 6:
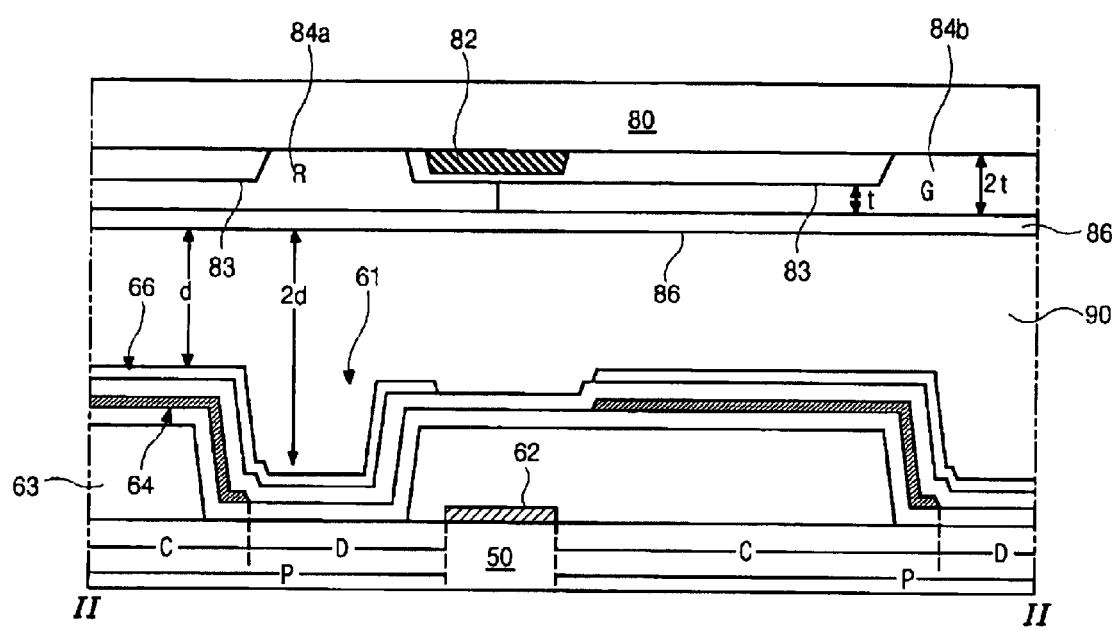
FIG. 6 is a schematic cross-sectional view of a transflective liquid crystal display device according to a fourth embodiment of the related art.
Figure 7:
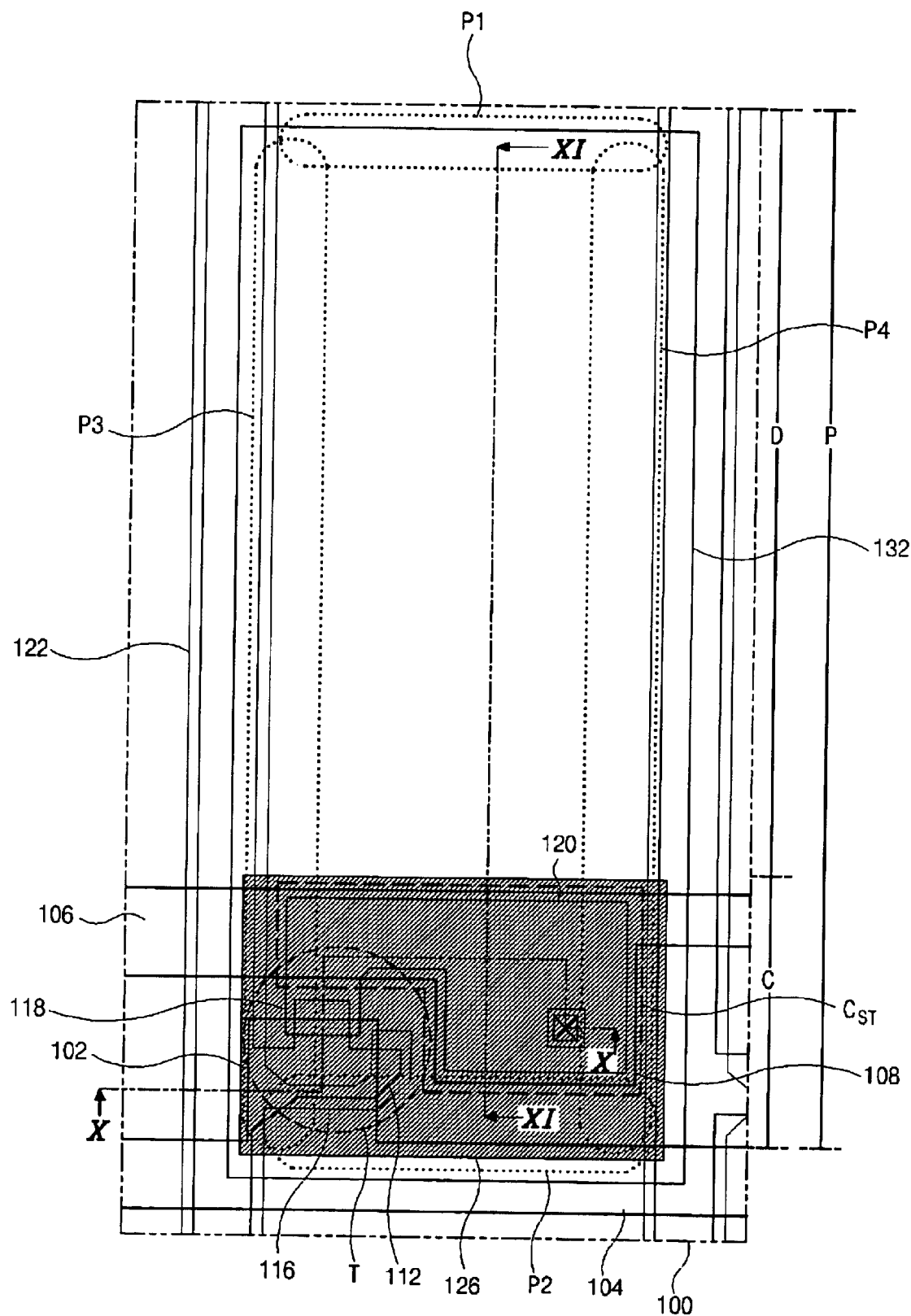
FIG. 7 is a schematic plane view of an array substrate for a transflective liquid crystal display device according to an embodiment of the present invention.

FIG. 7 is a schematic plane view of an array substrate for a transflective liquid crystal display device according to an embodiment of the present invention. A gate line 104 and a data line 122 are formed on a first substrate 100. The gate line 104 and the data line 122 cross each other to define a pixel region "P" including a reflective portion "C" and a transmissive portion "D." A thin film transistor (TFT) "T" including a gate electrode 102, an active layer 112, and source and drain electrodes 116 and 118 is formed adjacent to a cross of the gate line 104 and the data line 122. The gate electrode 102 is connected to the gate line 104 and the source electrode 116 is connected to the data line 122. The active layer 112 is formed over the gate electrode 102, and the source and drain electrodes 116 and 118 are spaced apart from each other. The reflective portion "C" is disposed at one side of the pixel region "P" adjacent to the gate line 104 and includes the TFT "T." The transmissive portion "D" is the other portion of the pixel region "P" except for the reflective portion "C."

A common line 106 corresponding to the reflective portion "C" is formed to be spaced apart and parallel to the gate line 104. A capacitor electrode 120 extending from the drain electrode 118 overlaps an extended portion 108 of the common line 106 to constitute a storage capacitor "$C_{ST}$." A reflective layer 126 corresponding to the reflective portion "C" and a transparent electrode 132 corresponding to the transmissive portion "D" are formed in the pixel region "P." The transparent electrode 132 is connected to the drain electrode 118. The reflective layer 126 may have an unevenness on its top surface to increase brightness and viewing angle of the reflective portion "C."

The pixel region "P" defined by the gate line 104 and the data line 122 has first to fourth side portions "p1" to "p4." The first and second side portions "p1" and "p2" are adjacent to the gate line 104, and the third and fourth side portions "p3" and "p4" are adjacent to the data line 122. The reflective portion "C" in which the reflective layer 126 is formed is near the second side portion "p2." Accordingly, the reflective portion "C" and the transmissive portion "D" are disposed at a top and bottom portion of the pixel region "P." Because the arrangement of the reflective portion "C" and the transmissive portion "D" is simple, a buffer layer for a dual color filter layer can be formed on a second substrate to have a simple shape.

Figure 8:
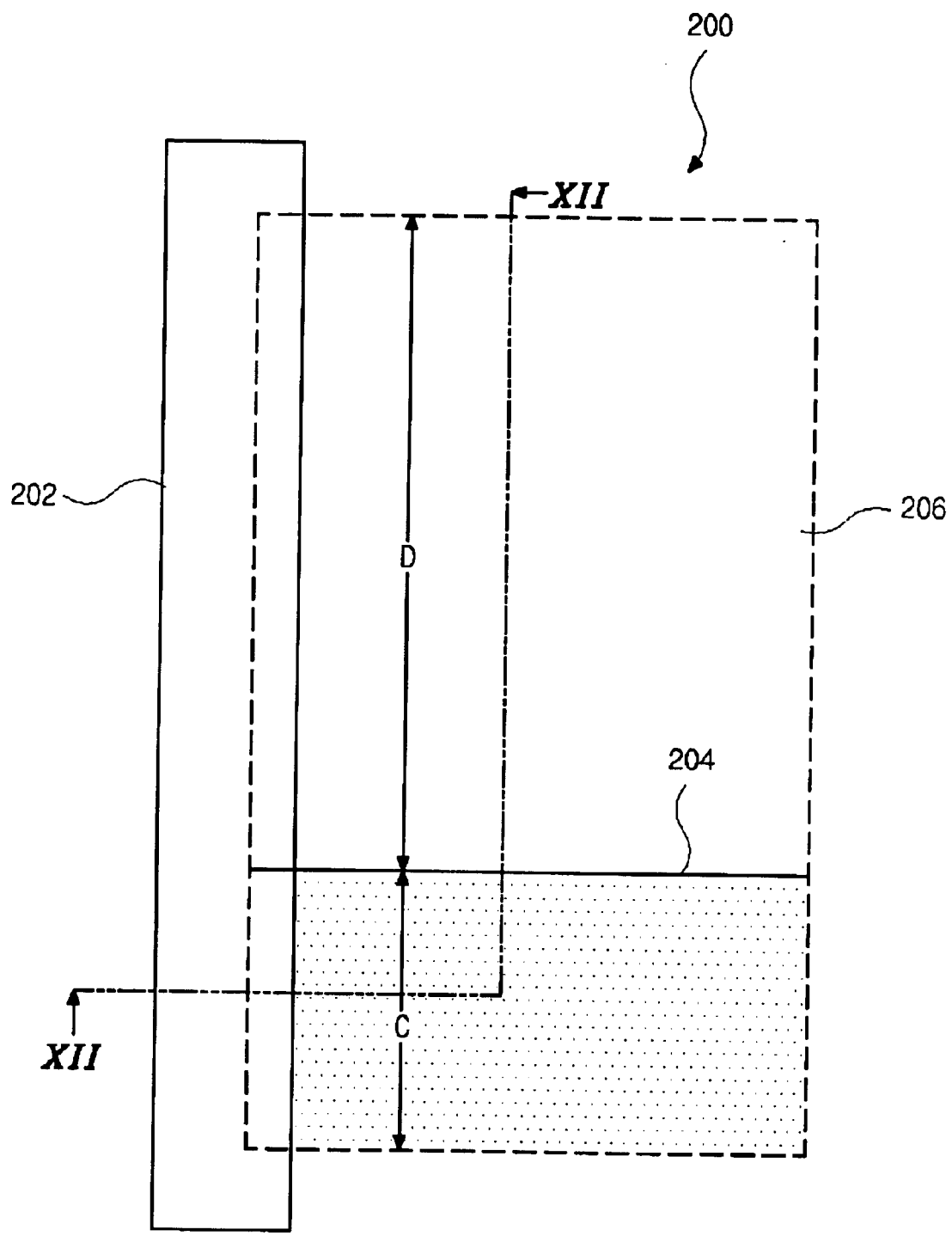
FIG. 8 is a schematic plane view showing one pixel region of a color filter substrate for a transflective liquid crystal display device according to an embodiment of the present invention.

FIG. 8 is a schematic plane view showing one pixel region of a color filter substrate for a transflective liquid crystal display device according to an embodiment of the present invention. A second substrate 200 includes a pixel region "P" having a reflective portion "C" and a transmissive portion "D." A black matrix 202 corresponding to a data line 122 (of FIG. 7) is formed on the second substrate 200. A buffer layer 204 is formed in the reflective portion "C." A color filter layer 206 is formed on the buffer layer 204 and substrate 200 to cover the pixel region "P."

Figure 9:
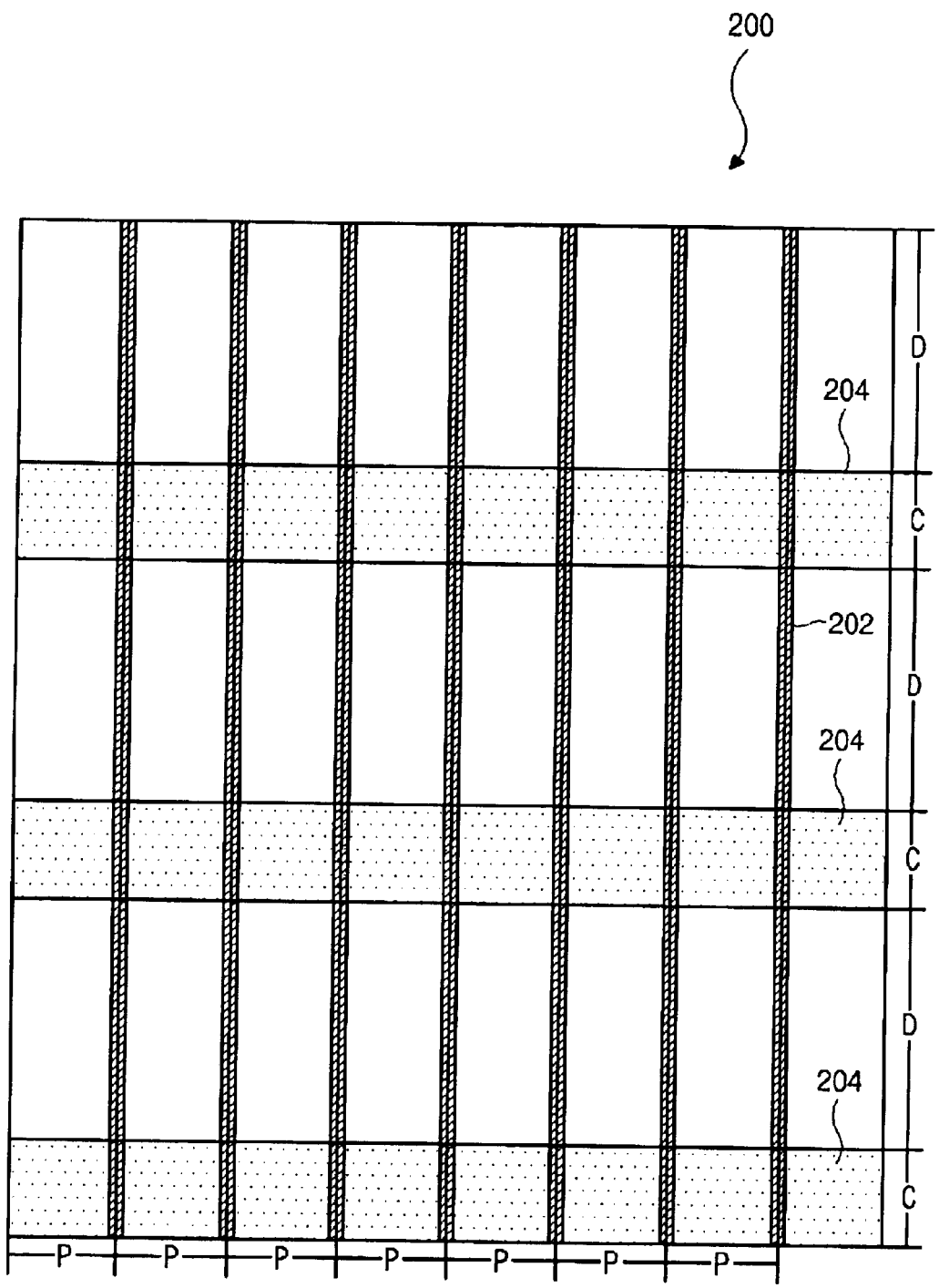
FIG. 9 is a schematic plane view showing a color filter substrate for a transflective liquid crystal display device according to an embodiment of the present invention.

FIG. 9 is a schematic plane view showing a color filter substrate for a transflective liquid crystal display device according to an embodiment of the present invention. A second substrate 200 includes a plurality of pixel regions "P" having a reflective portion "C" and a transmissive portion "D." A black matrix 202 is formed at a boundary of the adjacent pixel regions "P" along a direction of the data line 122 (of FIG. 7). The reflective portion "C" is disposed at a bottom portion of the pixel region "P" and extends to an adjacent pixel region "P." As a result, the reflective portion "C" crosses the black matrix 202 throughout the whole second substrate 200. Because a buffer layer 204 is formed in the reflective portion "C," the buffer layer 204 also extends to the adjacent pixel region "P." Accordingly, the buffer layer 204 has a simple structure and is easy to be fabricated. Moreover, a color filter layer 206 (of FIG. 8) having a dual thickness is also easily fabricated.

FIGS. 10A to 10F and FIGS. 11A to 11F are schematic cross-sectional views showing a fabrication process of an array substrate for a transflective liquid crystal display device according to an embodiment of the present invention. FIGS. 10A to 10F are taken along a line "X—X" of FIG. 7 and FIGS. 11A to 11F are taken along a line "XI—XI" of FIG. 7.

Figure 10A:
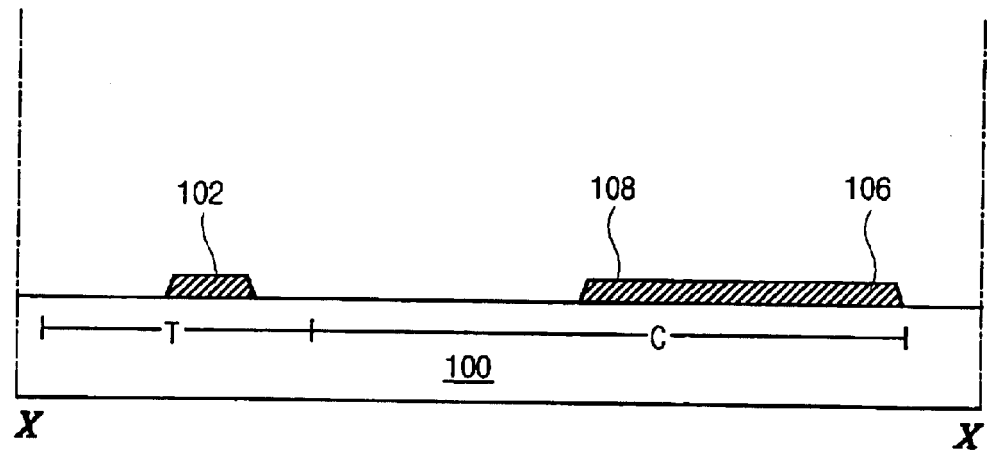
FIGS. 10A to 10F and FIGS. 11A to 11F are schematic cross-sectional views showing a fabrication process of an array substrate for a transflective liquid crystal display device according to an embodiment of the present invention.
Figure 11A:
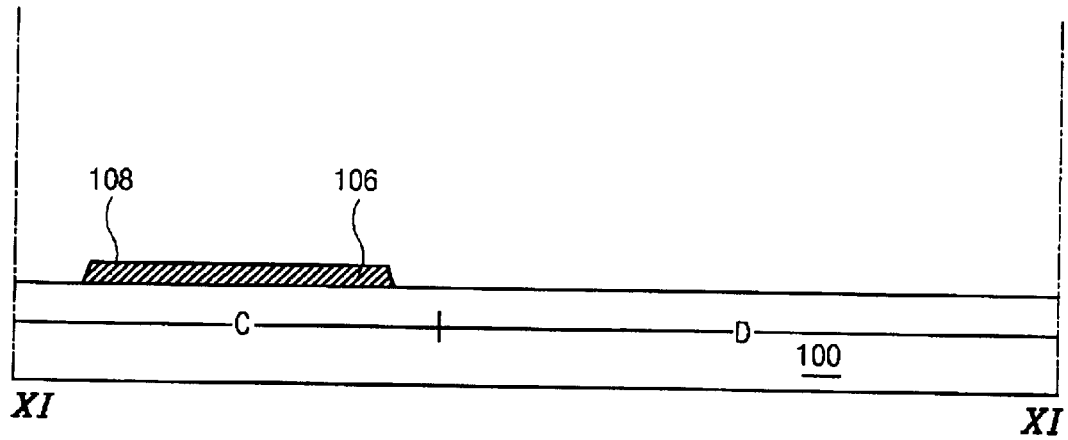

In FIGS. 10A and 11A, a gate electrode 102 and a gate line 104 (of FIG. 7) are formed on a first substrate 100 having a pixel region "P" including a reflective portion "C" and a transmissive portion "D." The gate electrode 102 and the gate line 104 (of FIG. 7) may be made of one of aluminum (Al), tungsten (W), chromium (Cr) and molybdenum (Mo) having a low resistance to reduce the resistance-capacitance (RC) delay. However, because a pure metal is chemically susceptible and can cause a line defect such as a hillock in a subsequent high temperature process, the gate electrode 102 and the gate line 104 (of FIG. 7) may be made of an aluminum alloy such as aluminum-neodymium (AlNd) alloy or formed to have a double layer such as aluminum/chromium (Al/Cr) and aluminum/molybdenum (Al/Nd). The gate electrode 102 extends from the gate line 104 (of FIG. 7). At the same time, a common line 106 is formed on the first substrate 100. The common line 106 is parallel to and spaced apart from the gate line 104 (of FIG. 7). The common line 106 includes an extended portion 108 corresponding to the reflective portion "C." The extended portion 108 functions as a first electrode of a storage capacitor fabricated in a subsequent process.

Figure 10B:
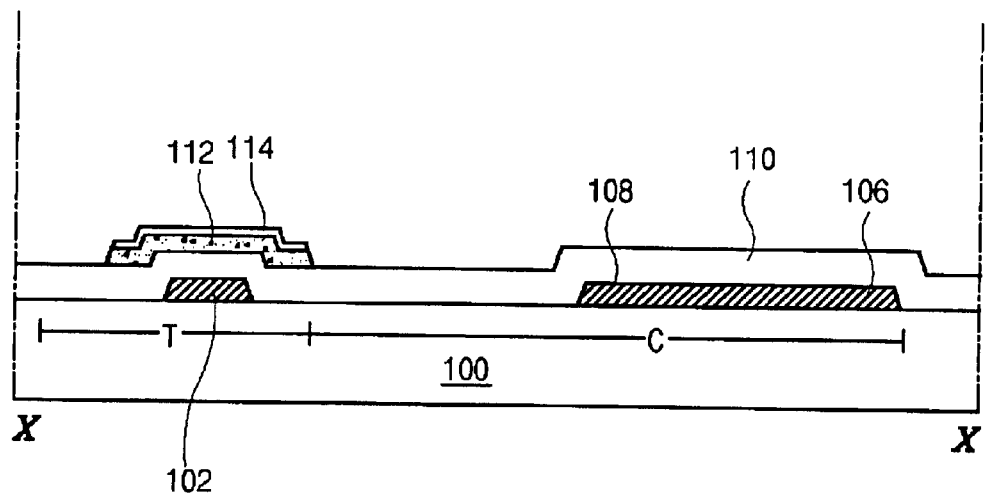
Figure 11B:
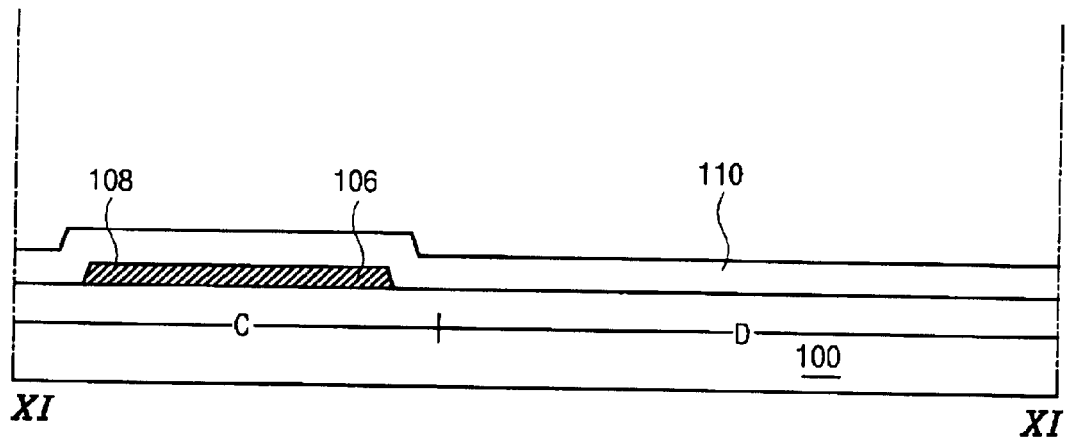

In FIGS. 10B and 11B, a first insulating layer 110 (a gate insulating layer) is formed on the gate electrode 102 by depositing one of an inorganic insulating material such as silicon nitride ($SiN_x$) and silicon oxide ($SiO_2$) and an organic insulating material such as benzocyclobutene (BCB) and acrylic resin. An active layer 112 of intrinsic amorphous silicon (a-Si:H) and an ohmic contact layer 114 of impurity-doped amorphous silicon (n+ or p+a-Si:H) are formed on the first insulating layer 110 over the gate electrode 102.

Figure 10C:
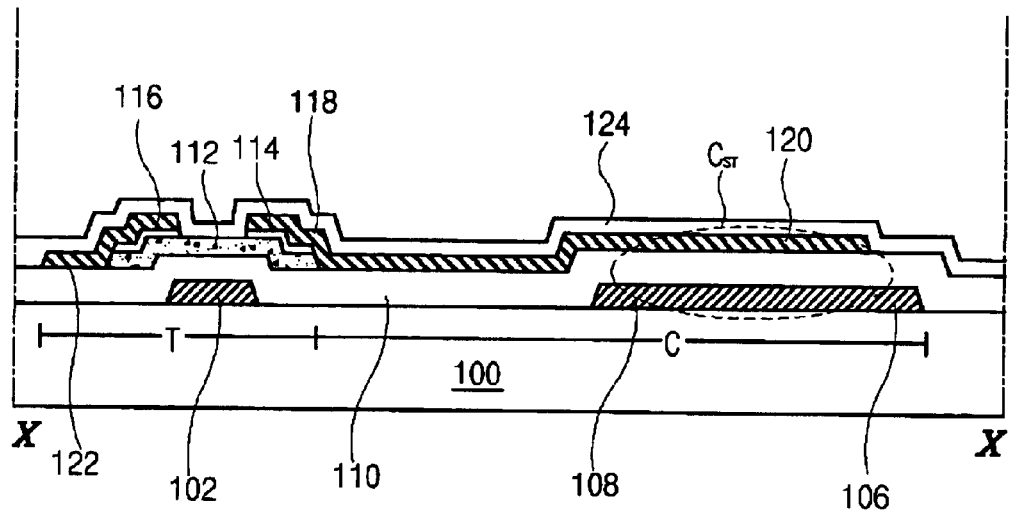
Figure 11C:
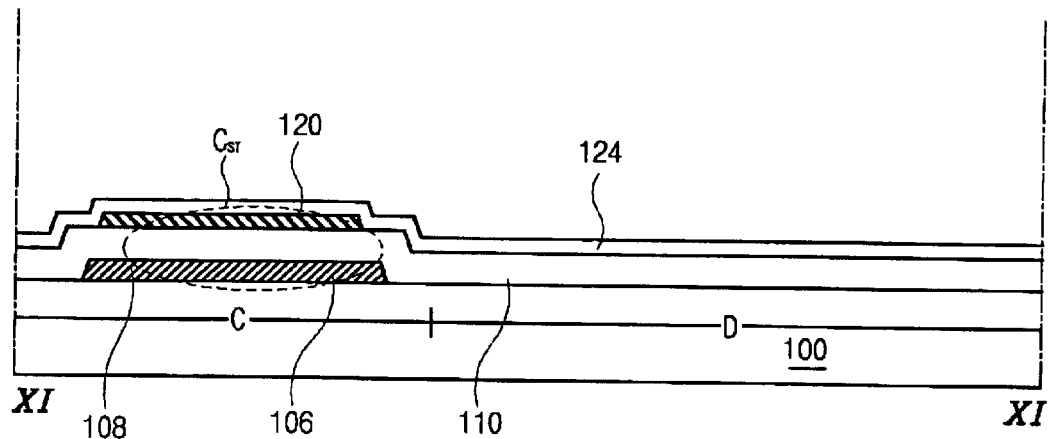

In FIG. 10C and 11C, source and drain electrodes 116 and 118 are formed on the ohmic contact layer 114. At the same time, a data line 122 and a capacitor electrode 120 is formed on the first insulating layer 110. The data line 122 is connected to the source electrode 116 and the capacitor electrode 120 extends from the drain electrode 118. The capacitor electrode 120 overlaps the extended portion 108 of the common line 106 to constitute a storage capacitor "$C_{ST}$" with the first insulating layer 110 in between. A second insulating layer 124 (a passivation layer) is formed on the source and drain electrodes 116 and 118 by depositing one of an inorganic insulating material such as silicon nitride ($SiN_x$) and silicon oxide ($SiO_2$).

Figure 10D:
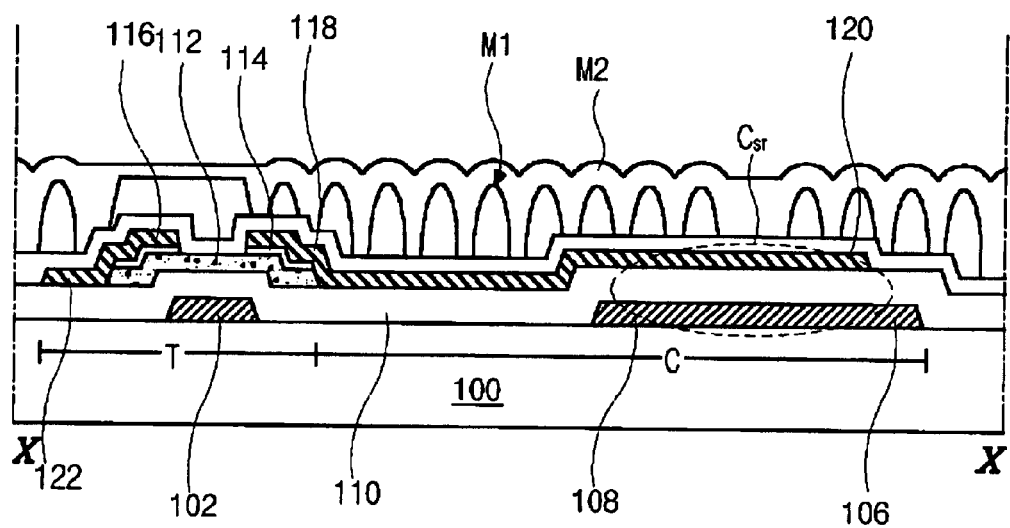
Figure 11D:
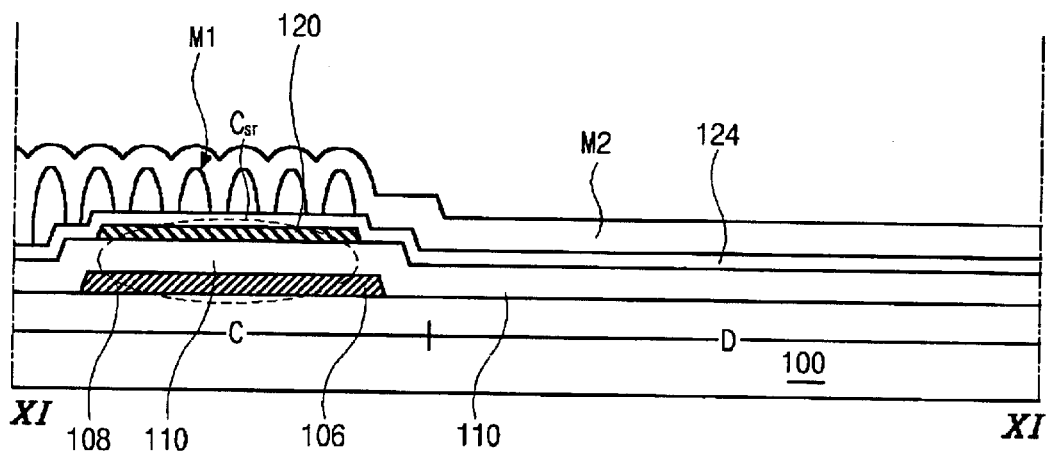

In FIGS. 10D and 11D, a plurality of bumps "M1" are formed on the second insulating layer 124 by depositing and patterning an organic material such as resin. The plurality of bumps "M1" have an embossed shape through a photolithographic process and a curing process. Sequentially, a third insulating layer "M2" is formed on the plurality of bumps "M1" by depositing an organic material such as resin. The third insulating layer "M2" has an unevenness on its top surface due to the plurality of bumps "M1."

Figure 10E:
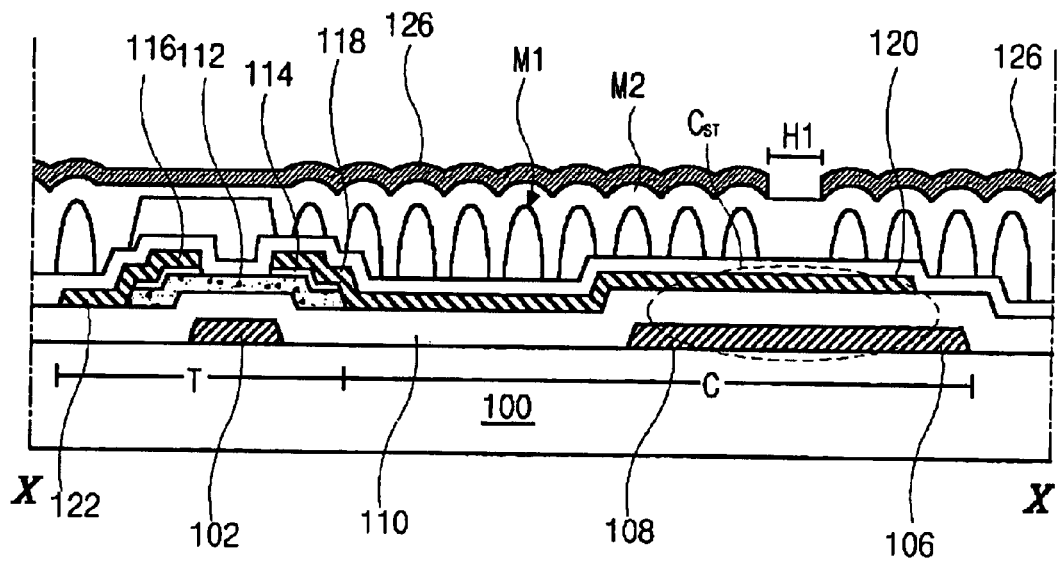
Figure 11E:
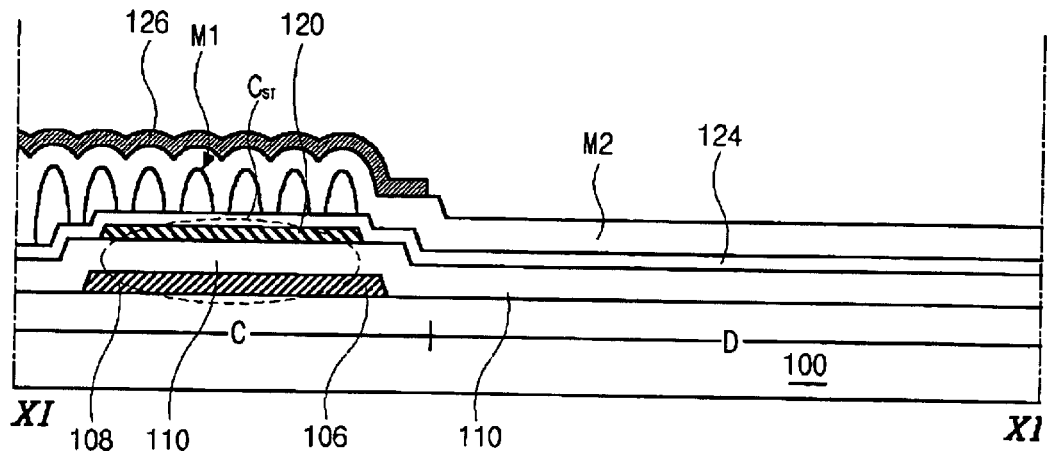

In FIGS. 10E and 11E, a reflective layer 126 corresponding to the reflective portion "C" is formed on the third insulating layer "M2" by depositing and patterning one of silver (Ag), aluminum (Al) and aluminum (Al) alloy such as aluminum-neodymium (AlNd) having a high reflectivity. The reflective layer 126 has a hole "H1" exposing the third insulating layer "M2."

Figure 10F:
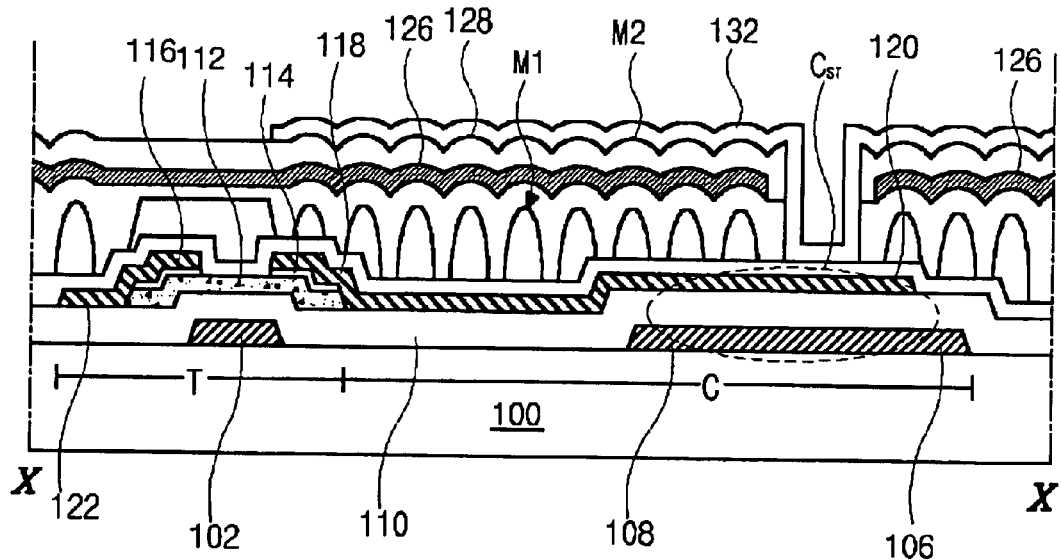
Figure 11F:
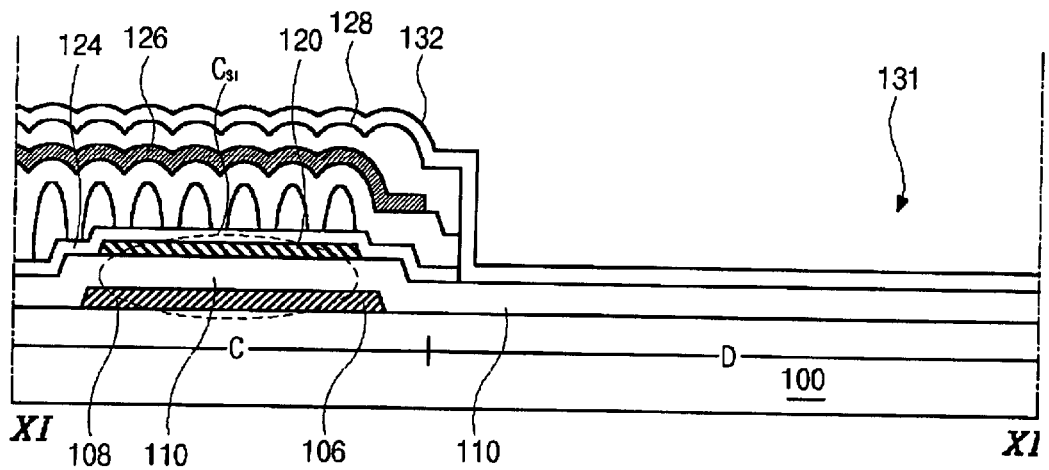

In FIGS. 10F and 11F, a fourth insulating layer 128 is formed on the reflective layer 126 by depositing one of an inorganic insulating material such as silicon nitride ($SiN_x$) and silicon oxide ($SiO_2$) and an organic insulating material such as benzocyclobutene (BCB) and acrylic resin. Sequentially, the fourth insulating layer 128 corresponding to the hole "H1" is patterned to expose the capacitor electrode 120 extending from the drain electrode 118. The fourth insulating layer 128 has an open portion 131 corresponding to the transmissive portion "D" to form a step for a dual cell gap. A transparent electrode 132 (a pixel electrode) corresponding to the pixel region "P" is formed on the fourth insulating layer 128 by depositing and patterning a transparent conductive material such as indium-tin-oxide (ITO) and indium-zinc-oxide (IZO). The transparent electrode 132 is connected to the drain electrode 118 through the capacitor electrode 120.

Figure 12A:
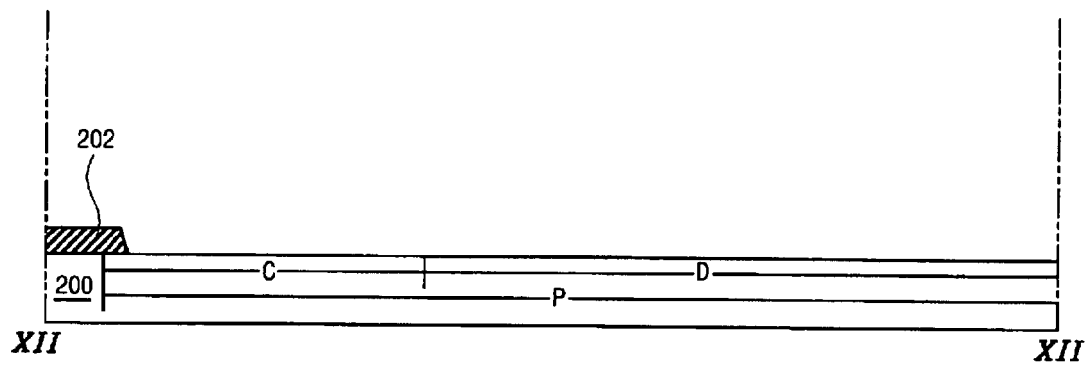
FIGS. 12A to 12C are schematic cross-sectional views showing a fabrication process of a color filter substrate for a transflective liquid crystal display device according to an embodiment of the present invention.
Figure 12B:
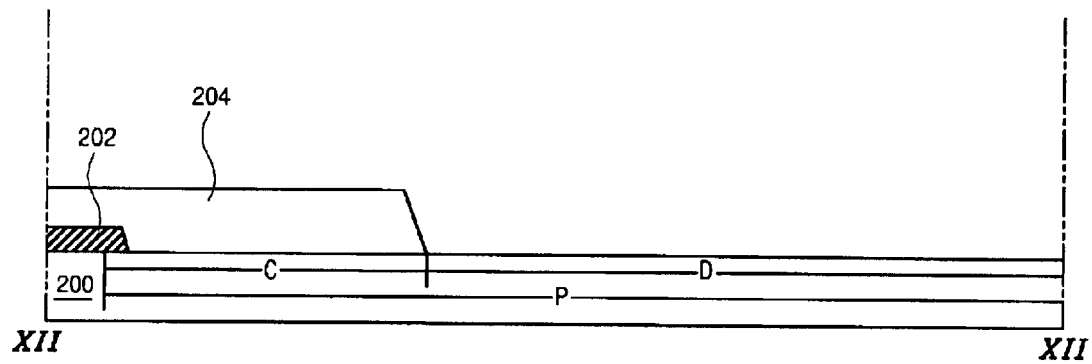
Figure 12C:
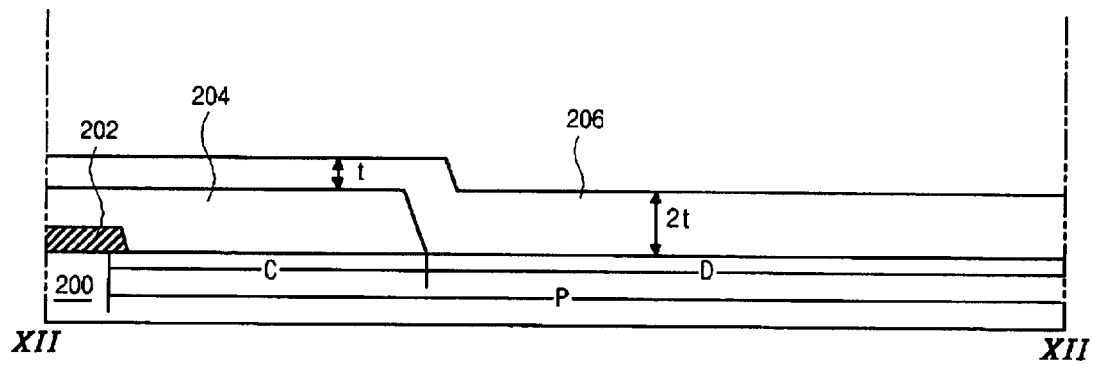

FIGS. 12A to 12C are schematic cross-sectional views showing a fabricating process for a color filter substrate for a transflective liquid crystal display device according to an embodiment of the present invention. FIGS. 12A to 12C are taken along a line "XII—XII" of FIG. 8. A black matrix 202 corresponding to a data line 120 (of FIG. 7) is formed on a second substrate 200 having a pixel region "P" including a reflective portion "C" and a transmissive portion "D" by depositing and patterning an opaque metallic material such as chromium (Cr). The black matrix 202 may be formed to have a double layer of chromium/chromium oxide (Cr/CrOx).

In FIG. 12B, a transparent buffer layer 204 is formed on the black matrix 202 by depositing and patterning an organic insulating material. The buffer layer 204 corresponds to the reflective portion "C."

In FIG. 12C, a color filter layer 206 corresponding to the pixel region "P" is formed on the buffer layer 204 by coating a color resin. The color filter layer 206 has a first thickness "t" in the reflective portion "C" and a second thickness "2t" in the transmissive portion "D" due to the buffer layer 204. The second thickness "2t" of the color filter layer 206 is substantially twice of the first thickness "t" of the color filter layer 206. Even though not shown in FIG. 12C, a common electrode is formed on the color filter layer 206.

The array substrate of FIGS. 10A to 11F and the color filter substrate of FIGS. 12A to 12C are attached to form a transflective liquid crystal display device.

Figure 13:
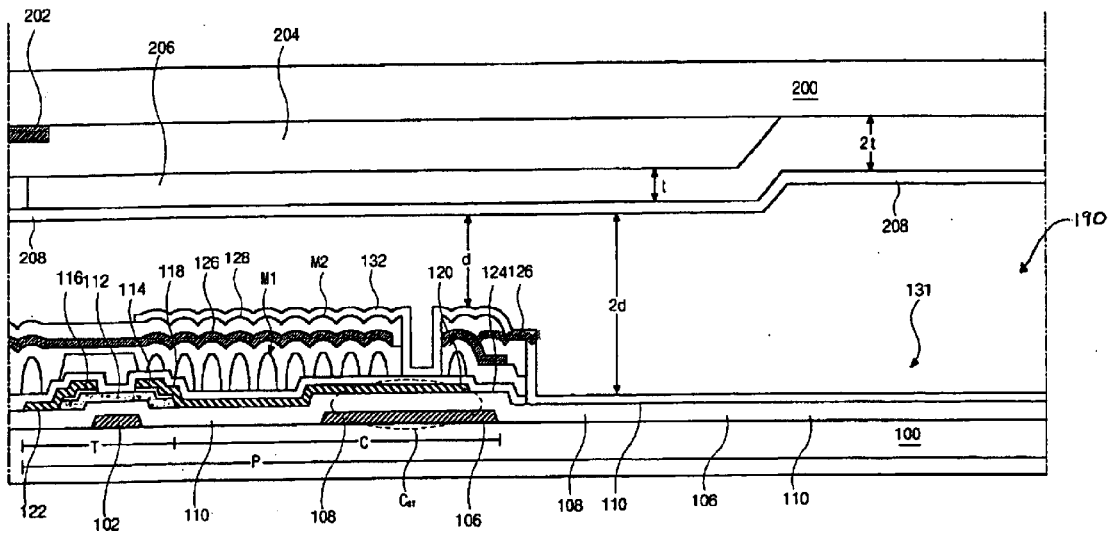
FIG. 13 is a schematic cross-sectional view of a transflective liquid crystal display device according to an embodiment of the present invention.

FIG. 13 is a schematic cross-sectional view of a transflective liquid crystal display device according to an embodiment of the present invention. First and second substrates 100 and 200 face each other and are spaced apart from each other. A gate line (not shown) and a data line 122 are formed on an inner surface of the first substrate 100. The gate line and the data line 122 cross each other to define a pixel region "P" including a reflective portion "C" and a transmissive portion "D." A thin film transistor (TFT) "T", including a gate electrode 102, an active layer 112, and source and drain electrodes 116 and 118, is disposed at an intersection of the gate line and the data line 122 and connected to the gate line and the data line 122. A common line 106 corresponding to the reflective portion "C" is spaced apart and parallel to the gate line. A capacitor electrode 120 extending from the drain electrode 118 overlaps an extended portion 108 of the common line 106 to constitute a storage capacitor "$C_{ST}$" with a first insulating layer 110 (a gate insulating layer) in between.

A reflective layer 126 corresponds to the reflective portion "C" and a transparent electrode 132 (a pixel electrode) corresponds to the transmissive portion "D." The transparent electrode 132 is connected to the drain electrode 118 through the capacitor electrode 120. A second insulating layer 128 between the reflective layer 126 and the transparent electrode 132 has an open portion 131 to form a dual cell gap.

A black matrix 202 corresponding to the data line 122 is formed on an inner surface of the second substrate 200. A buffer layer 204 corresponding to the reflective portion is formed on the black matrix 202 and substrate 200. A color filter layer 206 corresponding to the pixel region "P" is formed on the buffer layer 204. A common electrode 208 is formed on the color filter layer 206. A liquid crystal layer 190 is formed between the transparent electrode 132 and the common electrode 208. The liquid crystal layer 190 has a third thickness "d" in the reflective portion "C" and a fourth thickness "2d" in the transmissive portion. The fourth thickness "2d" of the liquid crystal layer 190 is substantially twice of the third thickness "d" of the liquid crystal layer 190.

In FIG. 13, the storage capacitor "$C_{ST}$" referred to as storage on common is disposed near the common line 106 and the TFT "T" is disposed adjacent to the storage capacitor "$C_{ST}$." Thus, the storage capacitor "$C_{ST}$" and the TFT "T" are disposed to correspond to the reflective portion "C." Because the reflective portion "C" is disposed at a bottom portion of the pixel region "P" and the transmissive portion "D" is the other portion of the pixel region "P," the reflective portion has a simple shape. Accordingly, the buffer layer 204 corresponding to the reflective portion "C" also has a simple shape so that the buffer layer 204 can be easily formed. This simple shape of the buffer layer 204 improves the controllability of the color filter layer 206. Therefore, the first and second thicknesses of the color filter layer 206 are easily controlled to have a ratio of 1:2. Moreover, an unevenness of the reflective layer 126 corresponding to the reflective portion "C" also can be obtained easily. Accordingly, the brightness and viewing angle of the transflective LCD device are improved.

Because the second insulating layer 128 has the open portion 131 corresponding to the transmissive portion "D," the third and fourth thicknesses of the liquid crystal layer 190 are easily controlled to have a ratio of 1:2. Accordingly, the transflective LCD device has uniform polarization characteristics in the reflective mode and the transmissive mode. Therefore, uniform color in the reflective portion and the transmissive portion and high brightness are obtained. Moreover, the production yield is improved due to the buffer layer 204 having a simple shape.

The second insulating layer 128 having the open portion 131 is formed to be thick for a dual cell gap. However, the thick second insulating layer 128 causes a complicated fabricating process and a high cost. To solve this problem, the open portion 131 may be omitted, and the color filter layer may be formed to have a step for a dual cell gap in another embodiment of the present invention.

Figure 14:
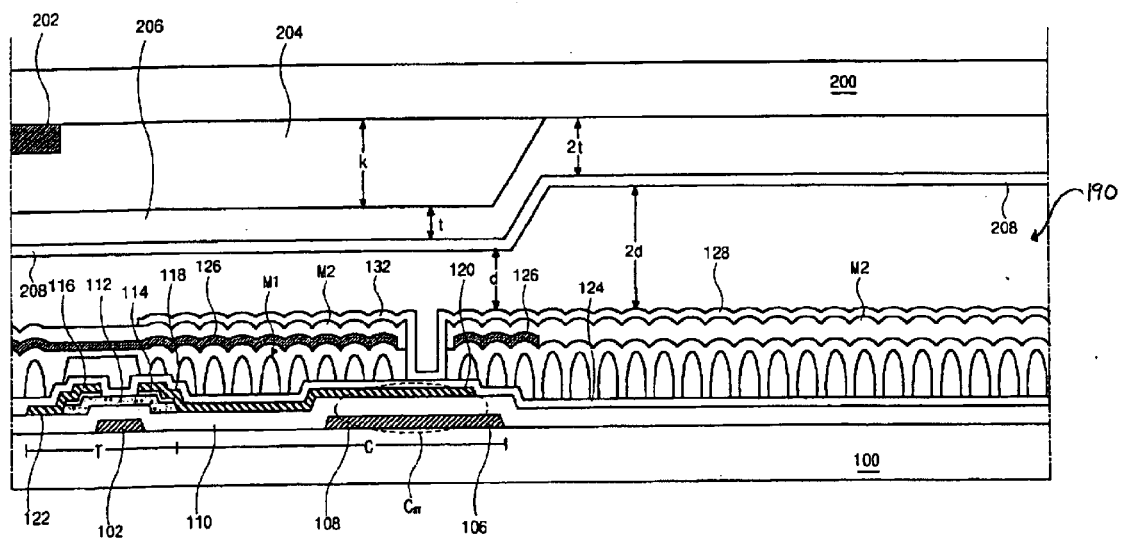
FIG. 14 is a schematic cross-sectional view of a transflective liquid crystal display device according to another embodiment of the present invention.

FIG. 14 is a schematic cross-sectional view of a transflective liquid crystal display device according to another embodiment of the present invention. First and second substrates 100 and 200 face each other and are spaced apart from each other. A gate line (not shown) and a data line 122 are formed on an inner surface of the first substrate 100. The gate line and the data line 122 cross each other to define a pixel region "P" including a reflective portion "C" and a transmissive portion "D." A thin film transistor (TFT) "T", including a gate electrode 102, an active layer 112, and source and drain electrodes 116 and 118, is disposed at an intersection of the gate line and the data line 122 and connected to the gate line and the data line 122. A common line 106 corresponding to the reflective portion "C" is spaced apart and parallel to the gate line. A capacitor electrode 120 extending from the drain electrode 118 overlaps an extended portion 108 of the common line 106 to constitute a storage capacitor "$C_{ST}$" with a first insulating layer 110 (a gate insulating layer) interposed in between.

A reflective layer 126 corresponds to the reflective portion "C" and a transparent electrode 132 (a pixel electrode) corresponds to the transmissive portion "D." The transparent electrode 132 is connected to the drain electrode 118 through the capacitor electrode 120. A second insulating layer 128 between the reflective layer 126 and the transparent electrode 132 does not have an open portion and a step for a dual cell gap.

A black matrix 202 corresponding to the data line 122 is formed on an inner surface of the second substrate 200. A buffer layer 204 corresponding to the reflective portion is formed on the black matrix 202 and substrate 200. A color filter layer 206 corresponding to the pixel region "P" is formed on the buffer layer 204. The buffer layer 204 has a specific thickness "k" to form a step in the color filter layer 206. For example, the thickness "k" of the buffer layer 204 may be within a range of about 2.5 μm to about 4.0 μm to make a step of the color filter layer 206 within a range of about 2.0 μm to about 2.5 μm. A common electrode 208 is formed on the color filter layer 206. A liquid crystal layer 190 is formed between the transparent electrode 132 and the common electrode 208. Accordingly, the liquid crystal layer 190 has a third thickness "d" in the reflective portion "C" and a fourth thickness "2d" in the transmissive portion without additional process for a dual cell gap. The fourth thickness "2d" of the liquid crystal layer 190 is substantially twice of the third thickness "d" of the liquid crystal layer 190.

Because a transflective liquid crystal display device has a dual cell gap and a dual color filter layer such that a liquid crystal layer has a thickness ratio of 1:2 and a color filter layer has a thickness ratio of 1:2 in a reflective portion and a transmissive portion, more uniform polarization characteristics and more uniform color purity may be obtained in the reflective portion and the transmissive portion. Therefore, a transflective LCD device having high brightness and high display quality may be obtained.

It will be apparent to those skilled in the art that various modifications and variation may be made in the present invention without departing from the spirit or scope of the invention. Thus, it is intended that the present invention cover the modifications and variations of this invention provided they come within the scope of the appended claims and their equivalents.

What is claimed is:

1. An array substrate for a transflective liquid crystal display device, comprising:
    a gate line on a substrate;
    a common line parallel to and spaced apart from the gate line;
    a data line crossing the gate line to define a pixel region having a transmissive portion and a reflective portion wherein the reflective portion includes an area between the common line and the gate line;
    a thin film transistor connected to the gate and data lines, the thin film transistor including a gate electrode, an active layer, and source and drain electrodes;
    a capacitor electrode extending from the drain electrode and overlapping the common line;
    a reflective layer covering the common line and the thin film transistor and corresponding to the reflective portion;
    an insulating layer on the reflective layer, the insulating layer having an open portion corresponding to the drain electrode; and
    a transparent electrode formed on a portion of the insulating layer and connected to the drain electrode and disposed in the pixel region.

2. The array substrate according to claim 1, wherein the reflective layer is adjacent to the gate line.

3. The array substrate according to claim 1, wherein the reflective layer has a rectangular shape.

4. The array substrate according to claim 1, wherein the transparent electrode contacts the capacitor electrode.

5. The array substrate according to claim 1, wherein the reflective layer is uneven.

6. The array substrate according to claim 1, wherein the reflective layer includes one of silver (Ag), aluminum (Al), and aluminum-neodymium (AlNd).

7. The array substrate according to claim 1, wherein the transparent electrode includes one of indium-tin-oxide (ITO) and indium-zinc-oxide (IZO).

8. The array substrate according to claim 1, wherein the insulating layer has an open portion corresponding to the transmissive portion.

9. A fabricating method of an array substrate for a transflective liquid crystal display device, comprising:
    forming a gate line, a gate electrode and a common line on a substrate having a pixel region including a transmissive portion and a reflective portion, the gate electrode being connected to the gate line, the common line being parallel to the gate line;
    forming a first insulating layer on the gate line, the gate electrode and the common line;
    forming an active layer on the first insulating layer over the gate electrode;
    forming source and drain electrodes on the active layer, a data line and a capacitor electrode on the first insulating layer, the source and drain electrodes being spaced apart from each other, the capacitor electrode extending from the drain electrode and overlapping the common line, the data line crossing the gate line and being connected to the source electrode, the gate electrode, the active layer and source and drain electrodes constituting a thin film transistor;
    forming a second insulating layer on the source and drain electrodes, the data line and the capacitor electrode;
    forming a reflective layer on the second insulating layer, the reflecting layer covering the common line and the thin film transistor;
    forming a third insulating layer on the reflective layer; and
    forming a transparent electrode on the third insulating layer in the pixel region, the transparent electrode being connected to the drain electrode.

10. The method according to claim 9, wherein the reflective layer is uneven.

11. The method according to claim 10, further comprising:
    forming a plurality of bumps on the second insulating layer in the pixel region, the plurality of bumps including an organic material; and
    forming a fourth insulating layer on the plurality of bumps, the fourth insulating layer including an organic insulating material.

12. The method according to claim 11, further comprising forming an open portion through the second to fourth insulating layer, the open portion corresponding to the transmissive portion.

13. The method according to claim 11, wherein the reflective layer, is rectangular.

14. A transflective liquid crystal display device, comprising:
    first and second substrates spaced apart from each other;
    a gate line on an inner surface of the first substrate;
    a common line parallel to and spaced apart from the gate line;
    a data line crossing the gate line to define a pixel region having a transmissive portion and a reflective portion wherein the reflective portion includes an area between the common line and the gate line;
    a thin film transistor connected to the gate and data lines, the thin film transistor including a gate electrode, an active layer, and source and drain electrodes;

a capacitor electrode extending from the drain electrode and overlapping the common line;

a reflective layer covering the common line and the thin film transistor and corresponding to the reflective portion;

an insulation layer on the reflective layer;

a transparent electrode formed on the insulating layer and connected to the drain electrode and disposed in the pixel region;

a black matrix on an inner surface of the second substrate;

a buffer layer on the black matrix, the buffer layer being transparent and corresponding to the reflective portion;

a color filter layer on the buffer layer in the pixel region, the color filter layer having a first thickness in the transmissive portion and a second thickness in the reflective portion, the first thickness being substantially twice of the second thickness;

a common electrode on the color filter layer; and a liquid crystal layer between the transparent electrode and the common electrode.

15. The device according to claim 14, wherein the buffer layer extends to a reflective portion of an adjacent pixel region.

16. The device according to claim 14, wherein the liquid crystal layer has a third thickness in the transmissive portion and a fourth thickness in the reflective portion, wherein the third thickness is substantially twice of the fourth thickness.

17. The device according to claim 14, wherein the reflective layer is adjacent to the gate line.

18. The device according to claim 17, wherein the reflective layer has a rectangular shape.

19. The device according to claim 14, wherein the transparent electrode contacts the capacitor electrode.

20. The device according to claim 14, wherein the reflective layer is uneven.

21. The device according to claim 14, wherein the reflective layer includes one of silver (Ag), aluminum (Al), and aluminum-neodymium (AlNd).

22. The device according to claim 14, wherein the transparent electrode includes one of indium-tin-oxide (ITO) and indium-zinc-oxide (IZO).

23. The device according to claim 14, further comprising an insulating layer having an open portion corresponding to the transmissive portion.

24. A fabricating method of a transflective liquid crystal display device, comprising:

forming a gate line, a gate electrode and a common line on a first substrate having a pixel region including a transmissive portion and a reflective portion, the gate electrode being connected to the gate line, the common line being parallel to the gate line;

forming a first insulating layer on the gate line, the gate electrode and the common line;

forming an active layer on the first insulating layer over the gate electrode;

forming source and drain electrodes on the active layer, a data line and a capacitor electrode on the first insulating layer, the source and drain electrodes being spaced apart from each other, the capacitor electrode extending from the drain electrode and overlapping the common line, the data line crossing the gate line and being connected to the source electrode, the gate electrode, the active layer and source and drain electrodes constituting a thin film transistor;

forming a second insulating layer on the source and drain electrodes, the data line and the capacitor electrode;

forming a reflective layer on the second insulating layer, the reflecting layer covering the common line and the thin film transistor;

forming a third insulating layer on the reflective layer;

forming a transparent electrode on the third insulating layer in the pixel region, the transparent electrode being connected to the drain electrode;

forming a black matrix on a second substrate having the pixel region including the transmissive portion and the reflective portion;

forming a buffer layer on the black matrix, the buffer layer being transparent and corresponding to the reflective portion;

forming a color filter layer on the buffer layer in the pixel region, the color filter layer having a first thickness in the transmissive portion and a second thickness in the reflective portion, the first thickness being substantially twice of the second thickness;

forming a common electrode on the color filter layer;

attaching the first and second substrates such that the transparent electrode faces into the common electrode; and forming a liquid crystal layer between the transparent electrode and the common electrode.

25. The method according to claim 24, wherein the reflective layer is uneven.

26. The method according to claim 25, further comprising:

forming a plurality of bumps on the second insulating layer in the pixel region, the plurality of bumps including an organic material; and forming a fourth insulating layer on the plurality of bumps, the fourth insulating layer including an organic insulating material.

27. The method according to claim 26, further comprising forming an open portion through the second to fourth insulating layer, the open portion corresponding to the transmissive portion.

28. The method according to claim 24, wherein the reflective layer is rectangular.

* * * * *